United States Patent
Choi et al.

(10) Patent No.: US 8,264,888 B2
(45) Date of Patent: Sep. 11, 2012

(54) FLASH MEMORY DEVICE CONFIGURED TO REDUCE COMMON SOURCE LINE NOISE, METHODS OF OPERATING SAME, AND MEMORY SYSTEM INCORPORATING SAME

(75) Inventors: Yoon-Hee Choi, Anyang-si (KR); Ki tae Park, Seongnam-si (KR); Bo Geun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 253 days.

(21) Appl. No.: 12/838,584

(22) Filed: Jul. 19, 2010

(65) Prior Publication Data

US 2011/0058427 A1    Mar. 10, 2011

(30) Foreign Application Priority Data

Sep. 10, 2009 (KR) .................. 10-2009-0085524

(51) Int. Cl.
  *G11C 16/04*   (2006.01)
  *G11C 16/06*   (2006.01)
(52) U.S. Cl. .......... 365/185.25; 365/185.18; 365/185.22
(58) Field of Classification Search .............. 365/185.25
  See application file for complete search history.

(56) References Cited

U.S. PATENT DOCUMENTS

| | | | | |
|---|---|---|---|---|
| 5,784,319 A * | 7/1998 | Villa et al. | ............... | 365/185.33 |
| 6,483,750 B2 * | 11/2002 | Dallabora et al. | ........ | 365/185.23 |
| 6,507,067 B1 * | 1/2003 | Fratin et al. | .................... | 257/315 |
| 6,735,125 B2 * | 5/2004 | Hirano | ..................... | 365/185.29 |
| 7,023,736 B2 | 4/2006 | Cernea et al. | | |
| 8,054,692 B2 * | 11/2011 | Kang et al. | ............... | 365/185.25 |
| 2011/0188310 A1 * | 8/2011 | Kim | ........................ | 365/185.11 |
| 2011/0194353 A1 * | 8/2011 | Hwang et al. | ............ | 365/185.19 |

FOREIGN PATENT DOCUMENTS

| | | |
|---|---|---|
| JP | 2006508483 | 3/2006 |
| KR | 1020050084584 A | 8/2005 |
| KR | 1020080103362 A | 11/2008 |
| KR | 1020090026502 A | 3/2009 |
| WO | 2004029984 A3 | 4/2004 |

* cited by examiner

*Primary Examiner* — Son Mai
(74) *Attorney, Agent, or Firm* — Volentine & Whitt, PLLC

(57) ABSTRACT

A flash memory device comprises memory cells connected between a bit line and a common source line, word lines connected to the memory cells, a common source line feedback circuit connected to a common source line (CSL) to detect the voltage level of the common source line, and a CSL feedback control logic configured to control a voltage level of a selected word line or a selected bit line to be compensated to a substantially constant value during a sensing operation of the memory cells based on the detected voltage level of the CSL.

20 Claims, 12 Drawing Sheets

FLASH MEMORY DEVICE CONFIGURED TO REDUCE COMMON SOURCE LINE NOISE, METHODS OF OPERATING SAME, AND MEMORY SYSTEM INCORPORATING SAME

CROSS-REFERENCE TO RELATED APPLICATIONS

This application claims priority under 35 U.S.C. §119 to Korean Patent Application No. 10-2009-0085524 filed on Sep. 10, 2009, the disclosure of which is hereby incorporated by reference in its entirety.

BACKGROUND

Embodiments of the inventive concept relate generally to nonvolatile memory devices. More particularly, embodiments of the inventive concept relate to flash memory devices configured to reduce noise from a common source line, methods of operating the same, and memory systems incorporating the same.

Semiconductor memory devices can be broadly classified as volatile memory devices or nonvolatile memory devices based on whether they retain stored data when disconnected from power. Volatile memory devices lose stored data when disconnected from power and nonvolatile memory devices retain stored data when disconnected from power.

Examples of volatile memory devices include dynamic random access memory (DRAM) devices and static random access memory (SRAM) devices. Examples of nonvolatile memory devices include electrically erasable and programmable read-only memory (EEPROM) devices, ferroelectric random access memory (FRAM) devices, phase-change random access memory (PRAM) devices, magnetic random access memory (MRAM) devices, and flash memory devices.

Flash memory devices, as compared with other types of nonvolatile memory devices, have relatively high programming speed, low power consumption, and large data storage capacity. Accordingly, flash memory devices are commonly used as data storage media in various fields requiring low-power and large-capacity storage devices, such as MP3 players, digital cameras, solid state drives (SSDs), and computer systems.

A flash memory device comprises a memory cell array that stores data. The memory cell array comprises a plurality of memory blocks, each of the memory blocks comprises a plurality of pages, and each of the pages comprises a plurality of memory cells. Due to its structural characteristics, the flash memory device performs erase operations on a memory block basis and performs read and write operations on a page basis.

Some flash memory devices store one bit of data per memory cell, and some flash memory devices store two or more bits of data per memory cell. A memory cell that stores one bit of data is called a single-level cell (SLC), and a memory cell that stores at least two bits of data is called a multi-level cell (MLC). An SLC has an erase state and a program state that correspond to two different threshold voltage distributions of the SLC. The MLC has an erase state and a plurality of program states that correspond to more than two different threshold voltage distributions of the MLC.

In a flash memory device comprising MLCs, it is important to maintain adequate margins between the different threshold voltage distributions so that different states can be distinguished from each other. One way to maintain adequate margins is to ensure that the threshold voltage distributions remain narrow, i.e., that they do not spread out. The threshold voltage distributions tend to spread out due to factors such as poor programming and electrical interference such as various forms of noise. Accordingly, reducing or eliminating these factors can lead to improved margins.

One form of noise that can cause threshold voltage distributions to spread out is common source line (CSL) noise, which is generated on a CSL connected to bit lines through a ground select transistor. The CSL noise typically occurs due to changes to the resistance of the CSL.

SUMMARY

Embodiments of the inventive concept provide nonvolatile memory devices capable of preventing threshold voltage distributions from spreading out due to CSL noise. Embodiments of the inventive concept also provide methods of operating the nonvolatile memory devices and systems incorporating the nonvolatile memory devices.

According to one embodiment of the inventive concept, a flash memory device comprises a plurality of memory cells connected between a bit line and a CSL, a plurality of word lines connected to the respective memory cells, a CSL feedback circuit connected to the common source line to detect a voltage level of the common source line, and CSL feedback control logic configured to control a voltage level of a selected word line or a selected bit line to be compensated to a constant level based on the voltage level detected by the CSL feedback circuit and independent of a voltage level change of the common source line during a sensing operation of the plurality of memory cells.

In certain embodiments, the CSL feedback control logic selectively interrupts compensation of the selected word line by causing the selected word line to be electrically floated during the sensing operation.

In certain embodiments, the CSL feedback control logic comprises a transistor configured to cut off a voltage from being transferred to the selected word line, a capacitor connected to the transistor to maintain an electrical floating state of the selected word line while the voltage is cut off from the selected word line, and switch logic connected to the transistor to control the transistor.

In certain embodiments, the CSL feedback control logic selectively interrupts compensation of the selected bit line by causing the gate of a transistor that selects the selected bit line to be electrically floated during the sensing operation.

In certain embodiments, the CSL feedback control logic comprises a first transistor configured to cut off a voltage from being transferred to a gate of a second transistor selecting the selected bit line, a capacitor connected to the gate of the second transistor to maintain an electrical floating state of the gate of the transistor selecting the selected bit line while the voltage is cut off from the gate of the second transistor, and a switch logic connected to the first transistor to control the first transistor.

In certain embodiments, the CSL feedback control logic converts the voltage level of the common source line into a digital value and selectively applies the converted voltage level to a voltage generator during the sensing operation to provide a voltage generation control code.

In certain embodiments, the CSL feedback control logic comprises an analog-to-digital converter configured to convert the voltage level of the common source line into the digital value, and a logic converter configured to selectively apply the converted voltage level to the voltage generator to provide the voltage generation control code.

According to another embodiment of the inventive concept, a method of operating a flash memory device comprises precharging a selected bit line connected to a selected memory cell, detecting a voltage level of a common source line before sensing a precharged voltage of the selected bit line, controlling a voltage level of a selected word line or a selected bit line of the selected memory cell to be compensated to a constant voltage based on the detected common source line voltage, and sensing the precharged voltage of the selected bit line.

In certain embodiments, the detecting of the voltage level of the common source line is completed before the sensing of the precharged voltage of the selected bit line.

In certain embodiments, the selected memory cell is a memory cell programmed to a target threshold voltage.

In certain embodiments, a program verify voltage is applied to the selected word line of the selected memory cell during the sensing of the precharged voltage of the selected bit line.

In certain embodiments, the selected word line is electrically floated after the voltage level of the selected word line is compensated to a constant voltage based on the detected common source line voltage.

In certain embodiments, the selected bit line is precharged through a transistor and the detected common source line voltage is compensated to produce a gate voltage of the transistor.

In certain embodiments, the gate of the transistor is electrically floated after the detected common source line voltage is compensated to produce the gate voltage of the transistor.

In certain embodiments, the voltage level the selected word line or the selected bit line compensated with the common source line voltage is maintained substantially constant during the sensing of the precharged voltage of the selected bit line, independent of a voltage change of the common source line.

According to still another embodiment of the inventive concept, a memory system comprises a flash memory device comprising a selected memory cell connected between a CSL and a selected bit line, and a selected word line connected to the selected memory cell, and a memory controller configured to control the flash memory device. The flash memory device is configured such that a voltage level of the selected word line or the selected bit line is compensated to a constant voltage during a sensing operation of the selected memory cell based on a noise voltage detected on the CSL.

In certain embodiments, the compensation of the selected word line is selectively interrupted by causing the selected word line to be electrically floated during the sensing operation.

In certain embodiments, the compensation of the selected bit line is selectively interrupted by causing a gate of a transistor that selects the selected bit line to be electrically floated during the sensing operation.

In certain embodiments, the voltage level of the selected word line or the selected bit line is maintained substantially constant during the sensing operation, independent of a voltage change of the common source line.

In certain embodiments, the flash memory device and the memory controller form a solid state drive.

BRIEF DESCRIPTION OF THE DRAWINGS

The attached drawings illustrate selected embodiments of the inventive concept. In the drawings, the relative dimensions of certain features may be exaggerated for clarity of illustration. In addition, like reference numbers denote like features.

DETAILED DESCRIPTION OF THE EMBODIMENTS

Selected embodiments of the inventive concept are described below with reference to the accompanying drawings. These embodiments are presented as teaching examples and should not be construed to limit the scope of the inventive concept.

As used herein, the term "and/or" includes any and all combinations of one or more of the associated listed items. Also, where one part (or element, device, etc.) is referred to as being "connected/coupled" to another part (or element, device, etc.), it should be understood that the former may be "directly connected" to the latter, or "indirectly connected" to the latter through at least one intervening part (or element, device, etc.). Terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept will be described in detail with reference to the accompanying drawings.

Figure 1:
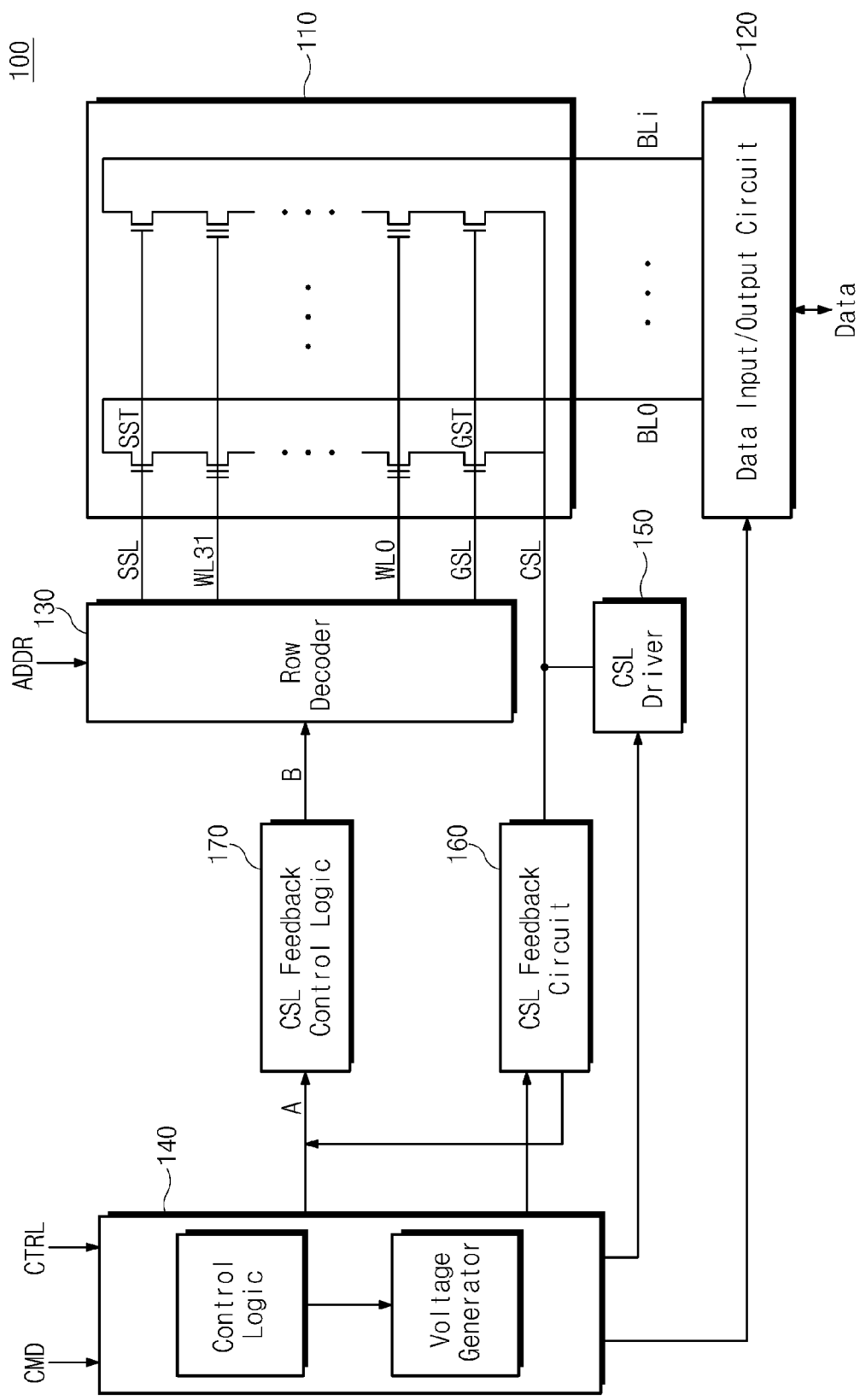
FIG. 1 is a block diagram of a flash memory device according to an embodiment of the inventive concept.

FIG. 1 is a block diagram of a flash memory device 100 according to an embodiment of the inventive concept.

Referring to FIG. 1, flash memory device 100 comprises a memory cell array 110, a data input/output circuit 120, a row decoder 130, a control logic/voltage generator 140, a CSL driver 150, a CSL feedback circuit 160, and CSL feedback control logic 170.

Memory cell array 110 comprises a plurality of memory blocks. One of these memory blocks is illustrated in FIG. 1. Each of the memory blocks comprises a plurality of pages, and each of the pages comprises a plurality of memory cells. Each of the memory cells can store single-bit data or multi-bit data. Due to its structural characteristics, flash memory device 100 performs an erase operation on a memory block basis and performs read and write operations on a page basis.

Each of the memory blocks comprises a plurality of cell strings. Each of the cell strings comprises a plurality of memory cells connected between a bit line BL and a common source line CSL. Referring to FIG. 1, each of the cell strings comprises a string select transistor SST connected to a string select line SSL, a plurality of memory cells connected to a plurality of word lines WL0~WL31, and a ground select transistor GST connected to a ground select line GSL. Each string select transistor SST is connected to a corresponding one of bit lines BL0~BLi, and each ground select transistor GST is connected to common source line CSL.

In a read operation of flash memory device 100, a power supply voltage $V_{CC}$ is applied to string select line SSL and ground select line GSL, a read voltage $V_{RD}$ is applied to a selected word line (e.g., WL0), and a pass voltage $V_{PASS}$ is applied to unselected word lines (e.g., WL1~WL31). Pass voltage $V_{PASS}$ is sufficient to turn on memory cells connected to the unselected word lines.

Data input/output circuit 120 is connected to memory cell array 110 via bit lines BL0~BLi. Data input/output circuit 120 inputs/outputs data through a data input/output line (labeled "Data"). Data input/output circuit 120 reads data stored in selected memory cells through bit lines BL0~BLi. The read data is output from flash memory device 100 via the data input/output line. Data input/output circuit 120 temporarily stores data to be programmed into the selected memory cells. The data stored in data input/output circuit 120 is programmed into the selected memory cells in a program operation.

The program operation comprises an operation for programming data in the selected memory cells and a program verify operation for verifying programmed states of the programmed memory cells. The program verify operation can be performed in a manner similar to a read operation for reading data from selected memory cells.

Row decoder 130 is connected to memory cell array 110 via word lines WL0-WL31. Row decoder 130 receives an address ADDR to select a memory block or a page. An address for selecting a memory block is called a block address, and an address for selecting a page is called a page address.

Control logic/voltage generator 140 comprises control logic (hereinafter, control logic 140) and a voltage generator (hereinafter, voltage generator 140). Control logic/voltage generator 140 controls data input/output circuit 120, row decoder 130, CSL driver 150, CSL feedback circuit 160 and CSL feedback control logic 170 in response to a command CMD and a control signal CTRL. Control signal CTRL is provided from a memory controller (see e.g., element 853 of FIG. 12) or a memory interface (see e.g., element 959 of FIG. 13). Voltage generator 140 generates bias voltage(s) to be provided to a word line and/or a bit line in a read, write, or erase operation. In a read operation, control logic/voltage generator 140 generates a read voltage $V_{RD}$ to be provided to a selected word line and a pass voltage $V_{PASS}$ to be provided to an unselected word line. Pass voltage $V_{PASS}$ is higher than read voltage $V_{RD}$. In a program verify operation, control logic/voltage generator 140 generates a program verify voltage $V_{VRF}$ to be provided to a selected word line.

CSL driver 150 is connected to common source line CSL. CSL driver 150 comprises a depletion-type MOS transistor (see e.g., element 153 of FIG. 2A) and an NMOS transistor (see e.g., element 157 of FIG. 2A). The transistors of CSL driver 150 are connected in series between common source line CSL and a ground terminal. Power supply voltage $V_{cc}$ is applied to a gate of the depletion-type MOS transistor, and a control signal $V_R$ is applied to a gate of the NMOS transistor. Control signal $V_R$ is activated in a read operation and a program verify operation, and is deactivated in other operations. The depletion-type MOS transistor can prevent the NMOS transistor from being damaged where a high voltage is transferred to common source line CSL.

CSL feedback circuit 160 is connected to common source line CSL. CSL feedback circuit 160 tracks a noise voltage of common source line CSL (hereinafter referred to as a CSL voltage $V_{CSL}$) in a program verify operation and compensates a selected word line or bit line for the noise voltage. A voltage supplied to a selected word line or bit line can be generated using a main ground voltage as a reference voltage. However, the memory cell operates using a voltage on common source line CSL as a reference voltage. In order to reduce a difference between these two reference voltages, CSL feedback circuit 160 compensates a selected word line or a bit line for CSL voltage $V_{CSL}$.

CSL feedback control logic 170 is controlled by control logic 140 to compensate for CSL voltage $V_{CSL}$. In particular, under the control of control logic/voltage generator 140, CSL feedback control logic 170 generates a voltage corresponding to CSL voltage $V_{CSL}$ as needed to perform the compensation.

CSL feedback control logic 170 is connected to control logic/voltage generator 140. CSL feedback control logic 170 controls whether a voltage compensated with CSL voltage $V_{CSL}$ is provided to a selected word line in a program verify operation. For example, CSL feedback control logic 170 can interrupt the supply of the voltage to the selected word line. Accordingly, the selected word line can be floated and selectively compensated with CSL voltage $V_{CSL}$.

Figure 2A:
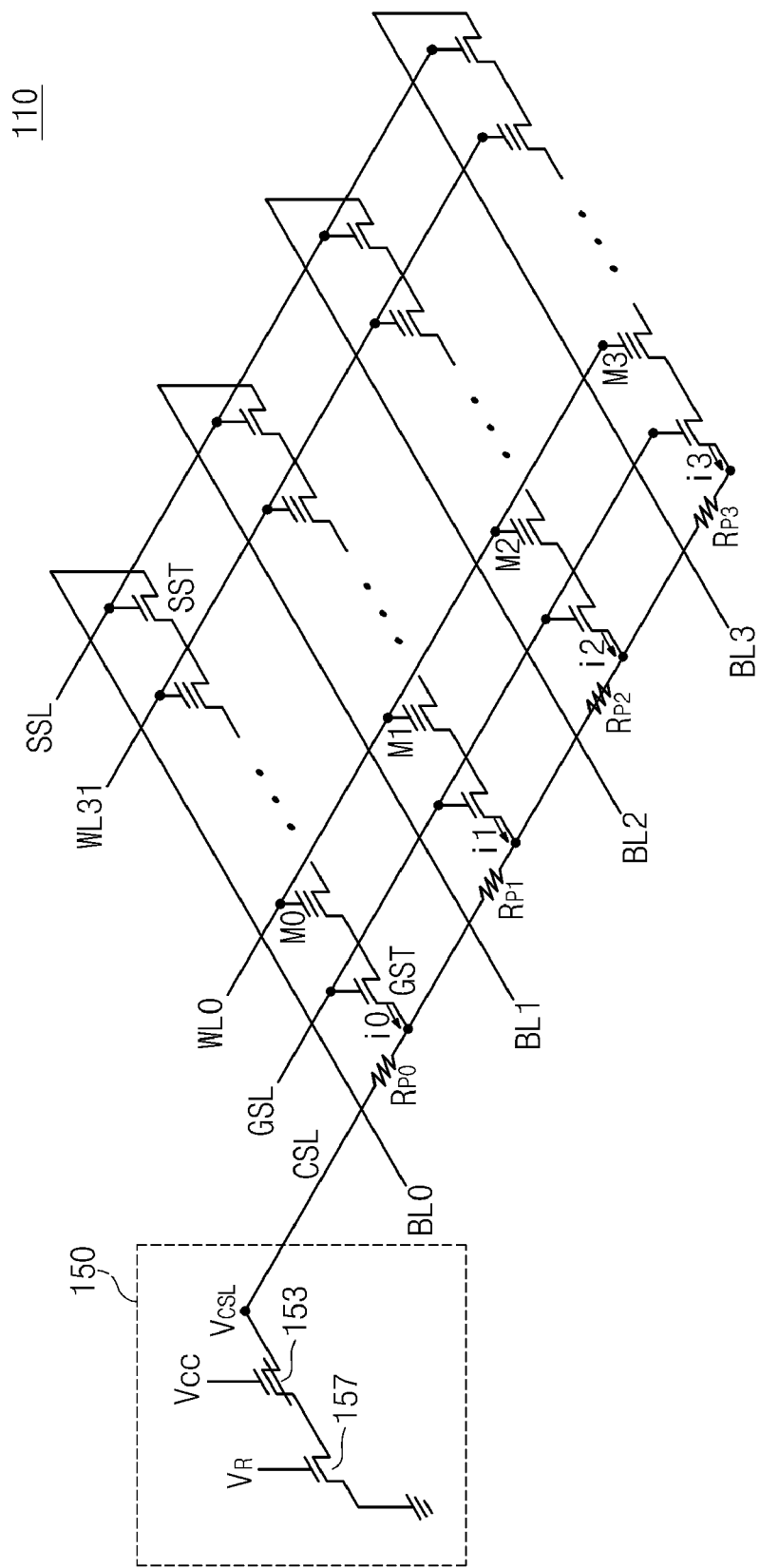
FIG. 2A is a circuit diagram illustrating cell strings of a memory cell array of FIG. 1.

FIG. 2A is a circuit diagram illustrating cell strings of memory cell array 110 of FIG. 1. In particular, FIG. 2A illustrates cells strings of one block of memory cells in memory cell array 110.

Referring to FIG. 2A, each of the cell strings comprises a plurality of memory cells connected between a bit line BL and a common source line CSL. Each of the cell strings comprises a string select transistor SST connected to a string select line SSL, a plurality of memory cells connected to a plurality of word lines WL0~WL31, and a ground select transistor GST connected to a ground select line GSL. String select transistor SST is connected to bit lines BL0~BLi, and ground select transistor GST is connected to common source line CSL. The labels $R_{P0}$, $R_{P1}$, $R_{P2}$ and $R_{P3}$ denote parasitic resistances or capacitances (hereinafter referred to as parasitic resistances) present in common source line CSL.

In the example of FIG. 2A, four cell strings are connected between common source line CSL and bit lines BLi (i=0, 1, 2, 3). CSL voltage $V_{CSL}$ changes depending on the amount of a current flowing through the cell strings connected to bit lines BLi. In a program verify operation, the amount of a current flowing through the cell strings changes depending on the number of "on" cells in the cell strings. An "on" cell is a cell that is turned on in response to a word line voltage applied thereto. For instance, where a read voltage is applied to word line WL0, a memory cell connected to wordline WL0 is turned on if its threshold voltage is below the read voltage.

The following two assumptions are made to describe a change in CSL voltage $V_{CSL}$ depending on the number of "on" cells. First, it is assumed that memory cells M0~M3 connected to a selected word line WL0 are programmed respectively to states E, P1, P2 and P3. In the description that follows, "E" denotes an erase state and "P1", "P2" and "P3" denote program states. States P1, P2 and P3 have incrementally higher threshold voltages. Accordingly, state P3 has the highest threshold voltage among states P1, P2 and P3. Second, it is assumed that currents flowing through the four cell strings corresponding to bitlines BL0, BL1, BL2 and BL3 are respectively i0, i1, i2 and i3 when memory cells M0~M3 are "on" cells.

Under the above assumptions, CSL voltage $V_{CSL}$ changes depending on the number of "on" cells. For example, where only memory cell M0 is an "on" cell and memory cells M1~M3 are "off" cells, CSL voltage $V_{CSL}$ is equal to i0×$R_{P0}$. As another example, where memory cells M0 and M1 are "on" cells and memory cells M2 and M3 are "off" cells, CSL voltage $V_{CSL}$ is equal to [(i0×$R_{P0}$)+(i1×$R_{P1}$)]. Similarly, where memory cells M0~M3 are "on" cells, CSL voltage $V_{CSL}$ is equal to [(i0×$R_{P0}$)+(i1×$R_{p1}$)+(i2×$R_{P2}$)+(i3×$R_{P3}$)]. Accordingly, CSL voltage $V_{CSL}$ changes with a change in the number of "on" cells in a program verify operation.

Figure 2B:
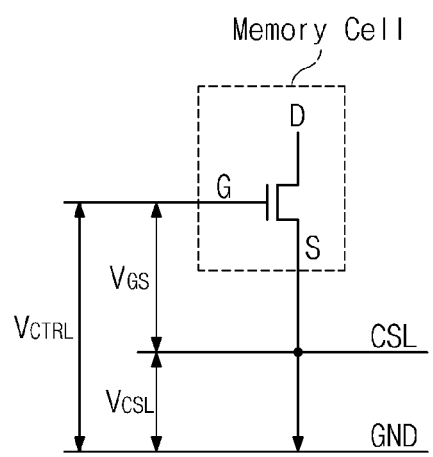
FIG. 2B is a circuit diagram illustrating an error in a threshold voltage of a memory cell of FIG. 1.

FIG. 2B is a diagram illustrating an error in a threshold voltage of a memory cell of FIG. 1.

Referring to FIG. 2B, where a current flows through common source line CSL of the memory cell, the voltage of common source line CSL can change due to parasitic resistance. Common source line CSL can have a CSL voltage $V_{CSL}$ depending on the voltage change of common source line CSL.

A voltage $V_{CTRL}$ supplied from voltage generator 140 of FIG. 1 to a control gate "G" of the memory cell is generated with reference to a ground voltage GND of the flash memory device. However, a channel of the memory cell formed in a program verify operation is controlled according to a gate-source voltage $V_{GS}$ between control gate "G" and a source "S" of the memory cell. Accordingly, there is a voltage difference $V_{CSL}$ between gate-source voltage $V_{GS}$ affecting the channel formation of the memory cell and voltage $V_{CTRL}$ supplied to control gate "G".

CSL voltage $V_{CSL}$ can cause a detection error of data input/output circuit 120 of FIG. 1 in a program verify operation of the memory cell. Unfortunately, however, CSL voltage $V_{CSL}$ depends on the data state of the memory cell, and therefore CSL voltage $V_{CSL}$ changes frequently. As a result, CSL voltage $V_{CSL}$ is difficult to eliminate.

Figure 3:
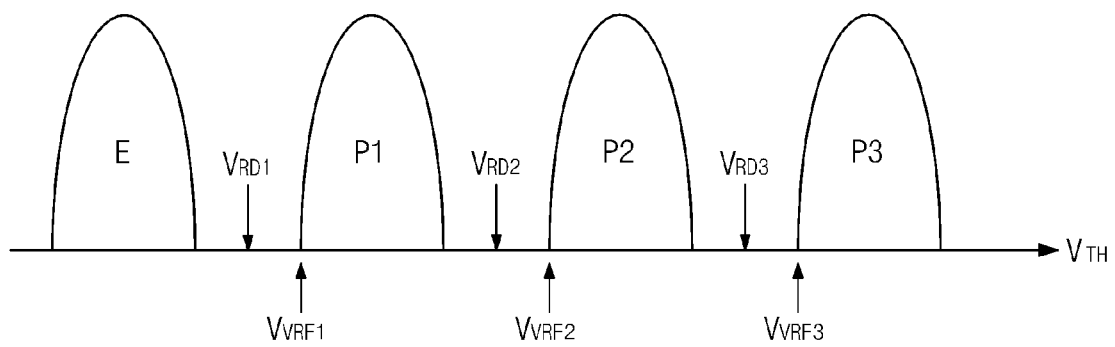
FIG. 3 is a diagram illustrating threshold voltage distributions of memory cells in the memory cell array of FIG. 1.

FIG. 3 is a diagram illustrating threshold voltage distributions of memory cells in the memory cell array of FIG. 1. In the example of FIG. 3, the memory cells are multi-level cells storing 2-bit data using program states P1, P2 and P3 and an erase state E. For explanation purposes, it will be assumed that the memory cells are connected to a selected word line WL0.

In a read operation, selected read voltages $V_{RD1}$, $V_{RD2}$ and $V_{RD3}$ are provided to the selected word line WL0 and a pass voltage $V_{PASS}$ is provided to unselected word lines WL1~WL31. Read voltage $V_{RD1}$ has a level between erase state E and first program state P1, read voltage $V_{RD2}$ has a level between the program state P1 and program state P2, and read voltage $V_{RD3}$ has a level between program state P2 and program state P3.

Where first read voltage $V_{RD1}$ is applied to selected wordline WL0, memory cells in erase state E become "on" cells and memory cells in program states P1, P2 and P3 become "off" cells. Where read voltage $V_{RD2}$ is applied to selected wordline WL0, memory cells in erase state E and program state P1 become "on" cells and memory cells in program states P2 and P3 become "off" cells. Where third read voltage $V_{RD3}$ is applied to selected wordline WL0, memory cells in erase state E and program states P1 and P2 become "on" cells and memory cells with program state P3 become "off" cells.

To ensure an adequate margin between adjacent states of the memory cells, an incremental step pulse program (ISPP) scheme is used to perform a program operation. In the ISPP scheme, after a 1-pulse program voltage is applied to program a memory cell, a program verify operation is performed to verify whether the memory cell is programmed. In the program verify operation, a selected bit line is precharged to a predetermined voltage, and then discharging of the selected bit line is monitored to verify whether the selected memory cell is programmed.

Where the program verify operation determines that the memory cell is not programmed, another 1-pulse program voltage is applied to the memory cell with an incremented voltage level. The program operation and the program verify operation repeat until the memory cell is programmed to a desired level. Where the program verify operation determines that the memory cell is programmed, the memory cell is program-inhibited by increasing its channel voltage in order to prevent further programming.

In the program verify operation, program verify voltages $V_{VRF1}$, $V_{VRF2}$ and $V_{VRF3}$ are provided to a selected word line. Program verify voltage $V_{VRF1}$ is used to program the memory cell to program state P1, program verify voltage $V_{VRF2}$ is used to program the memory cell to program state P2, and program verify voltage $V_{VRF3}$ is used to program the memory cell to program state P3.

Figure 4:
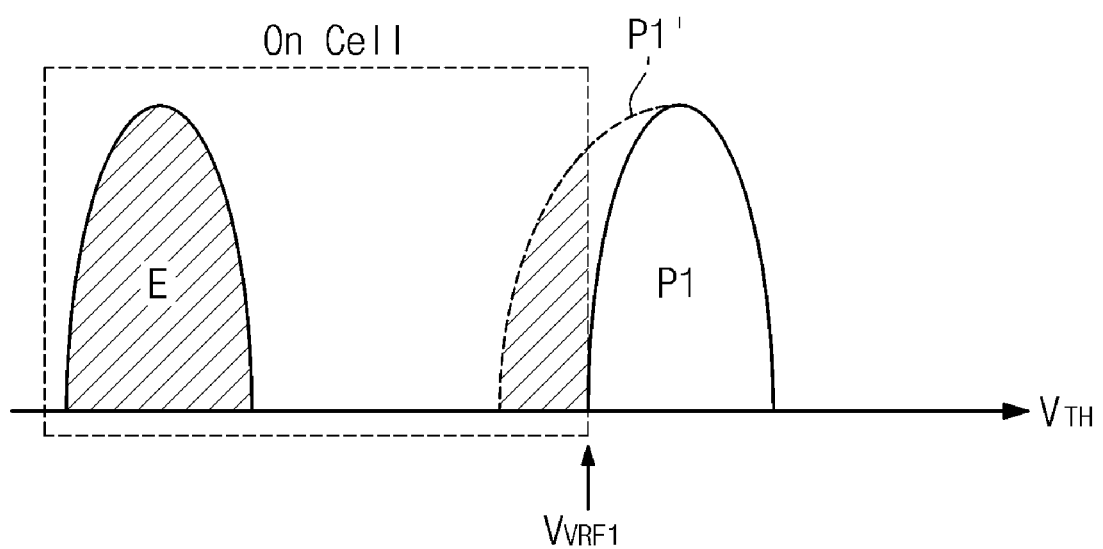
FIG. 4 is a diagram illustrating a number of "on" cells where a program verify voltage is applied to a selected word line.

FIG. 4 is a diagram illustrating a number of "on" cells where a program verify voltage is applied to a selected word line.

Although FIG. 4 illustrates the distribution of on cells in a program verify operation for programming a selected memory cell to program state P1, the distribution of on cells is represented similarly in the case of program states P2 and P3.

In FIG. 4, a cross-hatched region represents memory cells that are turned on in response to first program verify voltage $V_{VRF1}$. Among the memory cells to be programmed to program state P1, memory cells in erase state E and memory cells in a state P1' whose threshold voltages do not yet exceed first program verify voltage $V_{VRF1}$ are turned on.

In the example of FIG. 2A, common source line CSL is connected to the ground terminal through a metal line. Because the metal line has a resistance, CSL voltage $V_{CSL}$ changes when a current flows through common source line CSL. The change in CSL voltage $V_{CSL}$ is proportional to the cell current caused by an "on" cell. For example, CSL voltage $V_{CSL}$ increases when the amount of a current flowing through common source line CSL increases due to an increase in the number of on cells of the memory cells connected to the selected word line. Such a change in CSL voltage $V_{CSL}$ constitutes a noise voltage in common source line CSL.

Figure 5:
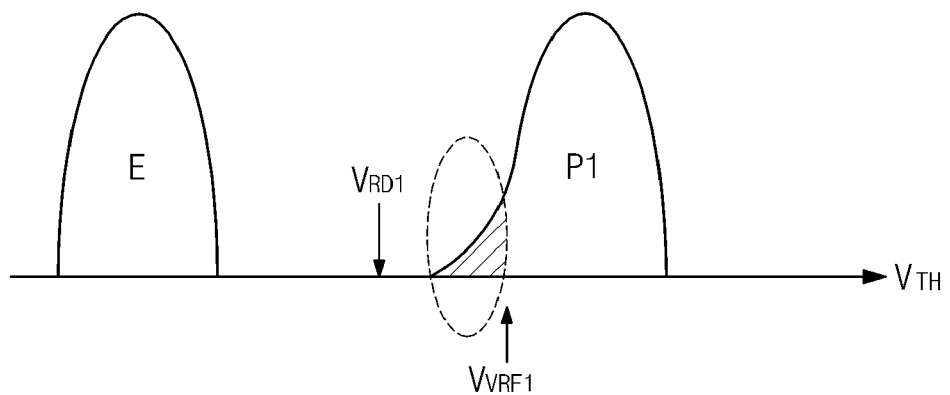
FIG. 5 is a diagram illustrating threshold voltage distributions of memory cells affected by noise present in a common source line voltage.

FIG. 5 is a diagram illustrating threshold voltage distributions of memory cells affected by a noise voltage present in a common source line voltage. Although FIG. 5 illustrates only program state P1, a change in threshold voltage distribution is represented similarly in the case of program states P2 and P3.

Referring to FIG. 5, as described above, the amount of a current flowing through common source line CSL increases when the number of "on" cells increases in a program verify operation. Where the amount of a current flowing through common source line CSL increases, CSL voltage $V_{CSL}$ increases due to parasitic resistance. Where CSL voltage $V_{CSL}$ increases, the amount of a current sensed by data input/ output circuit 120 of FIG. 1 tends to decrease. Where the amount of current sensed by data input/output circuit 120 of FIG. 1 decreases, a program operation may be completed after a determination that the threshold voltage distribution of the memory cell has reached program state P1. In this case, the width of the corresponding threshold voltage distribution may increase as represented by a cross-hatched region of FIG. 5.

Figure 6:
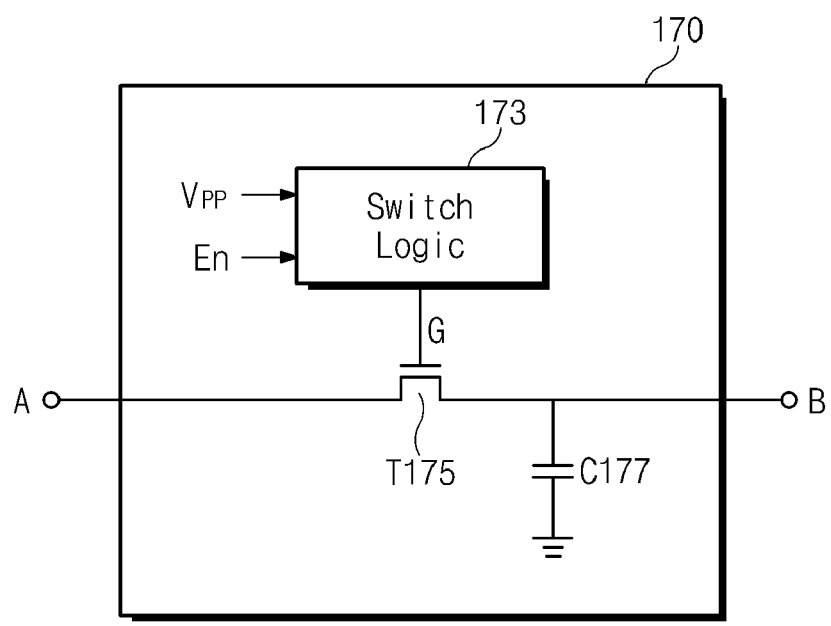
FIG. 6 is a block diagram illustrating common source line feedback control logic in the flash memory device of FIG. 1.

FIG. 6 is a block diagram illustrating CSL feedback control logic 170 of FIG. 1.

Referring to FIG. 6, CSL feedback control logic 170 comprises switch logic 173, a transistor T175, and a capacitor C177.

Switch logic 173 is connected to a control gate "G" of transistor T175. Switch logic 173 receives a voltage $V_{PP}$ and a control signal En from control logic/voltage generator 140 of FIG. 1. When applied to gate G of transistor T175, voltage $V_{PP}$ is sufficient to turn on transistor T175. In response to the control signal of control logic 140, switch logic 173 provides a signal to control gate G of transistor T175 to turn on/off transistor T175.

Where control signal En of control logic 140 is not applied to switch logic 173, switch logic 173 turns off transistor T175 to cut off a node "A" from a node "B". Thus, node B is electrically floated through capacitor C177.

Figure 7:
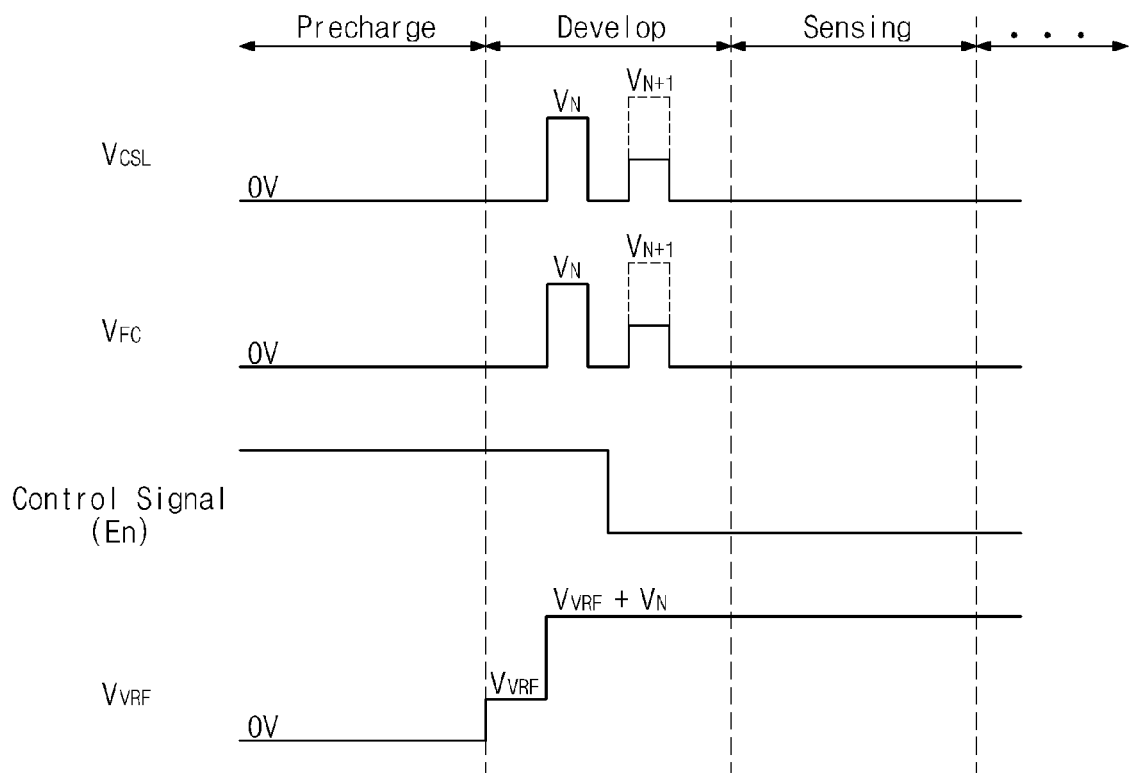
FIG. 7 is a timing diagram illustrating a verify voltage in a program verify operation according to an embodiment of the inventive concept.

FIG. 7 is a timing diagram illustrating a verify voltage in a program verify operation according to an embodiment of the inventive concept.

Referring to FIGS. 6 and 7, the program verify operation comprises a precharging step, a developing step, and a sensing step. The program verify operation can comprise additional steps such as a discharging step, but a description of such additional steps will be omitted as it is not necessary to explain the present embodiment.

In the precharging step, a selected bit line is precharged to a predetermined voltage. In the developing step, a program verify voltage $V_{VRF}$ is applied to a selected word line to classify a selected memory cell as an "on" cell or an "off" cell. In the sensing step, an amount of electrical discharge from the precharged bit line is detected to determine whether the selected memory cell is an "on" cell or an "off" cell. In other words, the sensing step senses whether a selected memory cell is programmed. During the sensing step, stable voltages should be applied to the selected word line and bit line because the operation of sensing the precharged bit line is short and is sensitive to a low noise voltage.

In the precharging step, program verify voltage $V_{VRF}$ is not applied to the selected word line and pass voltage $V_{PASS}$ is not applied to unselected word lines. Accordingly, CSL voltage $V_{CSL}$ is not generated by an on-cell current of the selected memory cell and a CSL compensation voltage $V_{FC}$ is not generated by CSL feedback circuit 160 during the precharging step.

In the developing step, program verify voltage $V_{VRF}$ is applied to the selected word line and pass voltage $V_{PASS}$ is applied to unselected word lines. Where the selected memory cell becomes an "on" cell in response to program verify voltage $V_{VRF}$, or unselected memory cells become "on" cells in response to pass voltage $V_{PASS}$, electric charges precharged in the selected bit line are discharged to common source line CSL and an on-cell current flows through common source line CSL. Thus, CSL voltage $V_{CSL}$ is generated by the on-cell current.

In the developing step, CSL voltage $V_{CSL}$ can change in response to changes in the state of the selected memory cell. These changes are illustrated in FIG. 7 by a first CSL voltage $V_N$ and a second CSL voltage $V_{N+1}$. Although FIG. 7 illustrates only two CSL voltages $V_N$ and $V_{N+1}$, various CSL voltages can generated according to the states of the selected memory cell. Also, for simplicity's sake, FIG. 7 illustrates CSL voltage $V_{CSL}$ with a constant level. However, CSL voltage $V_{CSL}$ can be generated with other levels and periods because it depends on the data state of the selected memory cell.

Where CSL voltage $V_{CSL}$ is generated on common source line CSL, CSL feedback circuit 160 tracks CSL voltage $V_{CSL}$ to generate compensation voltage $V_{FC}$ with a commensurate level. Compensation voltage $V_{FC}$ compensates for program verify voltage $V_{VRF}$ provided from voltage generator 140 to the selected word line. Thus, the program verify voltage compensated with CSL voltage $V_{CSL}$ of common source line CSL is provided to the selected word line.

Where control signal En is not supplied from control logic 140 to CSL feedback control logic 170, switch logic 173 turns off transistor T175. Where transistor T175 is turned off, the voltage transferred from voltage generator 140 to the selected word line is interrupted and the selected word line maintains an electrical floating state. The floated selected word line can maintain a constant voltage through capacitor C177. Accordingly, the selected word line maintains program verify voltage $V_{VRF}+V_N$ compensated with CSL voltage $V_{CSL}$ until the completion of a program verify operation.

As indicated by the foregoing, in certain embodiments, CSL voltage $V_{CSL}$ is selectively compensated for in a program verify operation. That is, CSL voltage $V_{CSL}$ is selectively compensated for according to the state of a selected memory cell and a resulting constant voltage is provided to the selected word line to perform a stable program verify operation.

Figure 8:
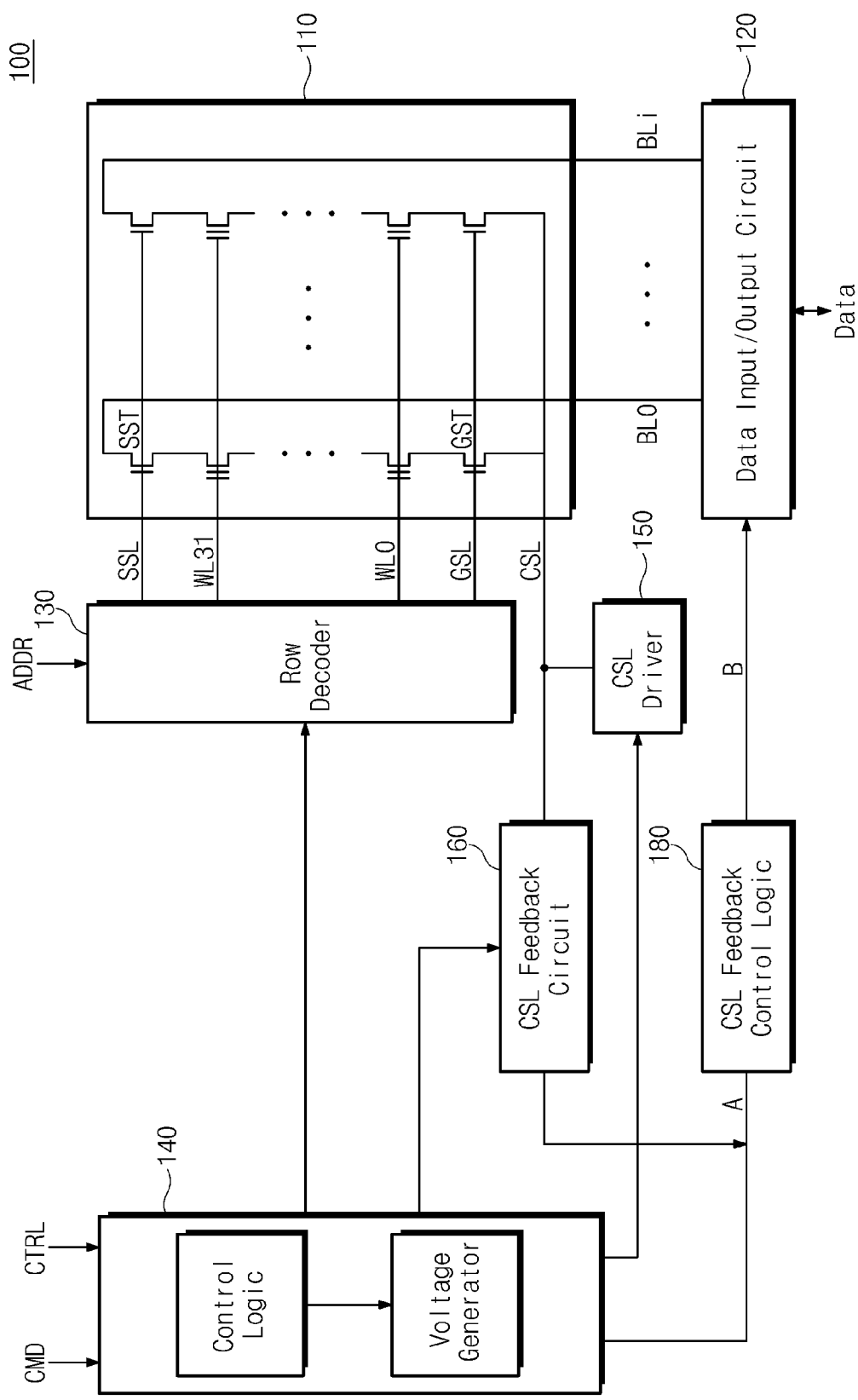
FIG. 8 is a block diagram of a flash memory device according another embodiment of the inventive concept.

FIG. 8 is a block diagram of flash memory device 100 according to another embodiment of the inventive concept. The embodiment of FIG. 8 is a variation of the embodiment of FIG. 1.

In the embodiment of FIG. 8, flash memory device 100 comprises memory cell array 110, data input/output circuit 120, row decoder 130, control logic/voltage generator 140, CSL driver 150, CSL feedback circuit 160, and CSL feedback control logic 180. With the exception of CSL feedback control logic 180, the numbered elements in FIG. 8 are the same as the corresponding elements in FIG. 1. Accordingly, a further description of the repeated elements will be omitted for conciseness.

CSL feedback control logic 180 is connected to data input/output circuit 120 and controls a selected bit line voltage in a program verify operation based on CSL voltage $V_{CSL}$. For instance, as indicated by an example presented in FIG. 9, CSL feedback control logic 180 can control the selected bit line voltage by adjusting channel formation in a transistor connected to the selected bitline in order to compensate for CSL voltage $V_{CSL}$.

Figure 9:
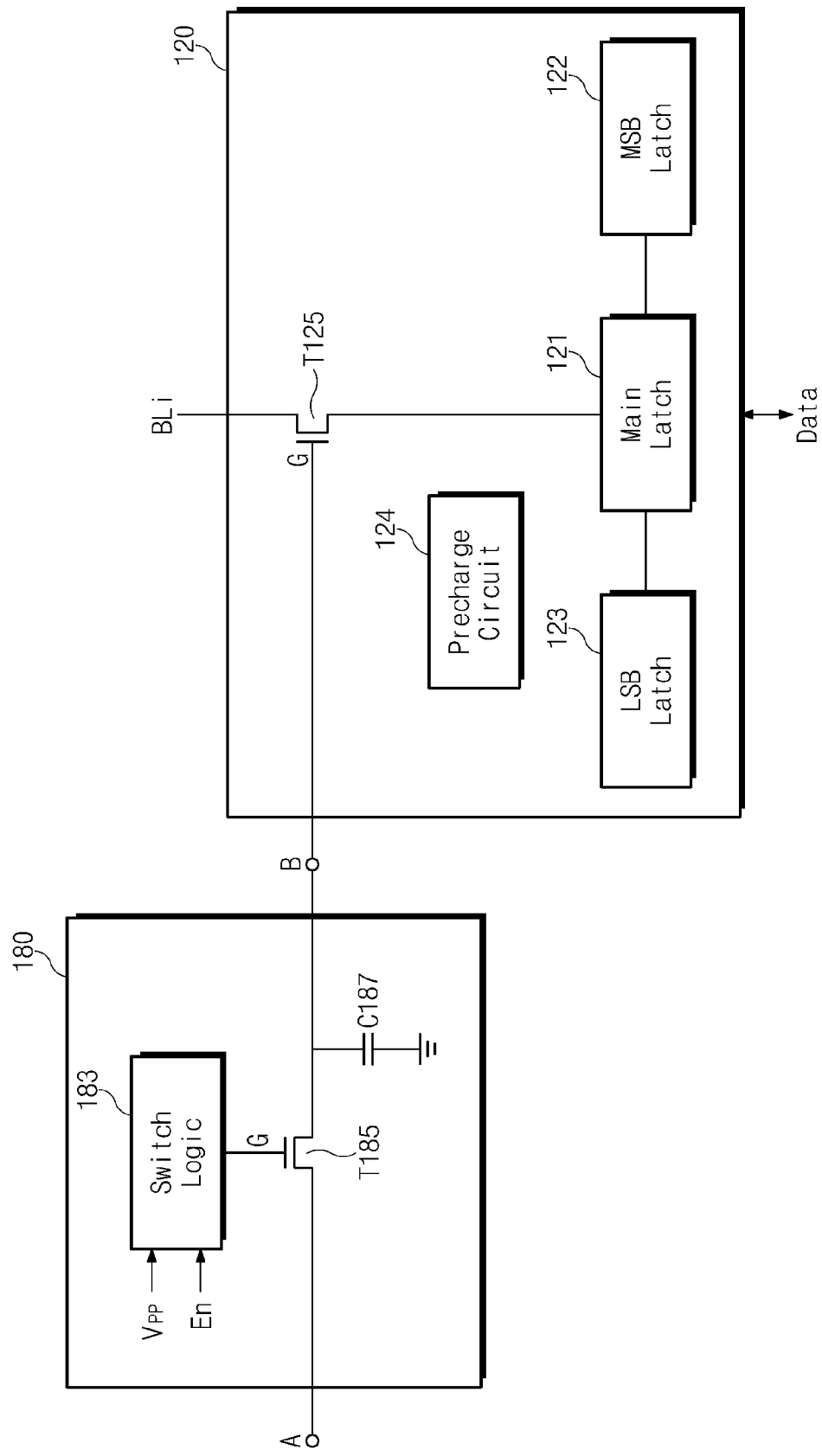
FIG. 9 is a block diagram illustrating a connection between a data input/output circuit and common source line feedback control logic in the flash memory device of FIG. 8.

FIG. 9 is a block diagram illustrating the connection between data input/output circuit 120 and CSL feedback control logic 180 of FIG. 8.

Referring to FIG. 9, CSL feedback control logic 180 is connected to a bit line select transistor T125 of data input/output circuit 120. CSL feedback control logic 180 comprises switch logic 183, a transistor T185, and a capacitor C187. The structure and operation of CSL feedback control logic 180 is substantially the same as CSL feedback control logic 170 described with reference to FIG. 6. Accordingly, a detailed description of CSL feedback control logic 180 will be omitted for conciseness.

Data input/output circuit 120 comprises a main latch circuit 121, data latch circuits 122 and 123, a precharge circuit 124, and a bit line select transistor T125. Main latch circuit 121 is connected to bit line BLi via bit line select transistor T125. Main latch circuit 121 temporarily stores program verify results in a program verify operation or stores the data of a selected memory cell in a read operation and outputs the same through a data input/output line (labeled "Data").

Data latch circuits 122 and 123 are connected to main latch circuit 121. The number of data latch circuits 122 and 123 varies depending on the number of data bits stored in each memory cell. For example, where 2-bit data is stored in a memory cell, an LSB latch circuit 123 and an MSB latch circuit 122 can be included as illustrated in FIG. 9. LSB latch circuit 123 is used to store LSB data, and MSB latch circuit 122 is used to store MSB data. LSB/MSB latch circuit 123/122 can retain LSB/MSB data in a program verify operation.

Precharge circuit 124 is connected to main latch circuit 121. Precharge circuit 124 precharges a selected bit line to a predetermined voltage in a program verify operation and in a read operation. Precharge circuit 124 typically comprises a transistor that provides a precharge voltage to a bit line under the control of control logic 140 of FIG. 8. Bit line select transistor T125 is connected to main latch circuit 121. Bit line select transistor T125 connects a bit line to main latch circuit 121 under the control of control logic 140 of FIG. 8.

The voltage on gate G of bit line select transistor T125 is compensated based on CSL voltage $V_{CSL}$ in a program verify operation to control bit line select transistor T125. This compensation affects the channel formation of bit line select transistor T125 and can be used to ensure proper precharging of bit line BLi.

The voltage applied to gate G of bit line select transistor T125 is provided through CSL feedback control logic 180. Thus, the voltage compensated based on CSL voltage $V_{CSL}$ is transferred or interrupted under the control of CSL feedback control logic 180. The varying CSL voltage $V_{CSL}$ is selectively compensated for according to the state of a memory cell and under the control of CSL feedback control logic 180, and a resulting constant voltage is provided to the selected bit line to perform a stable program verify operation.

Figure 10:
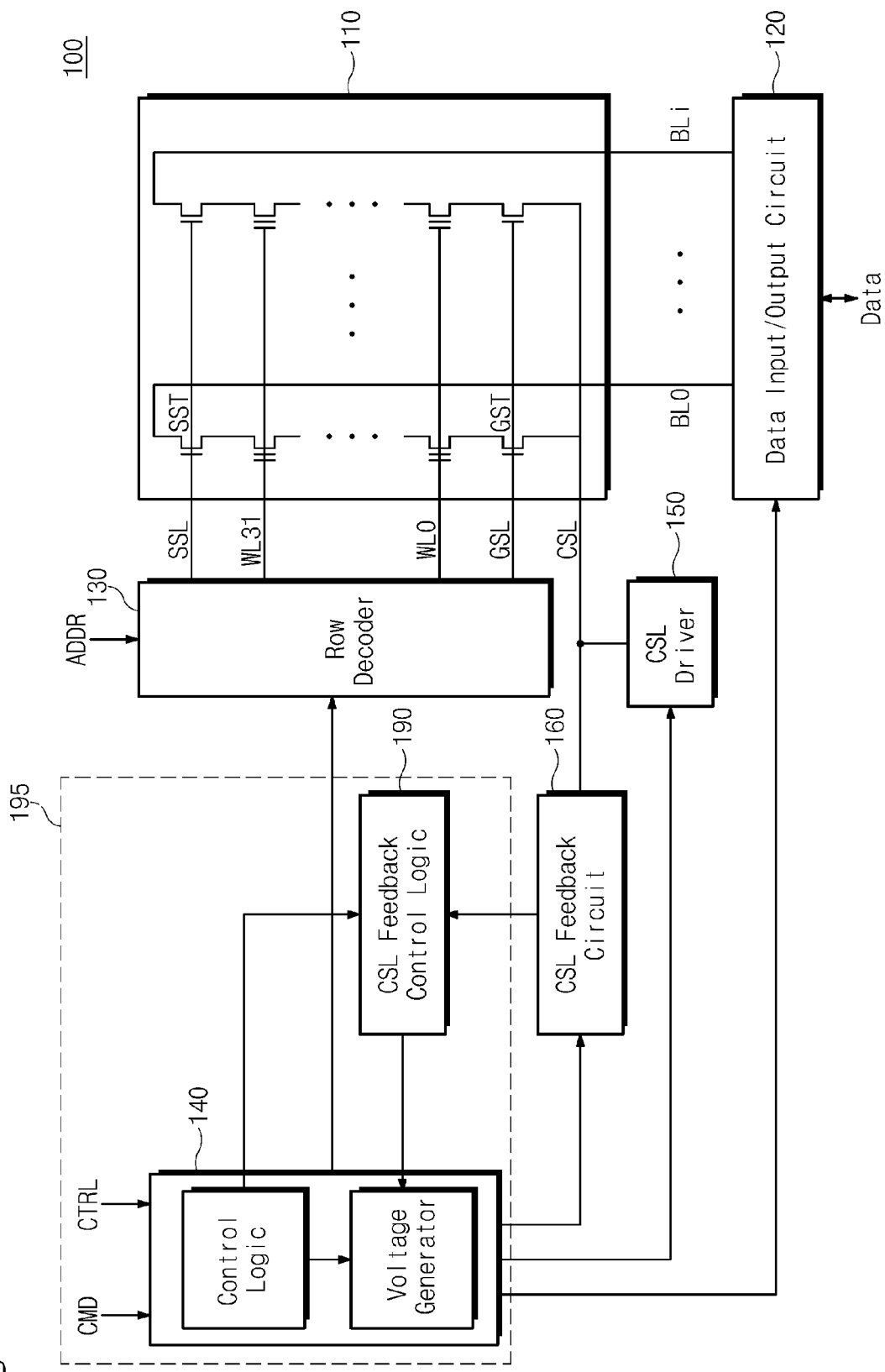
FIG. 10 is a block diagram of a flash memory device according to still another embodiment of the inventive concept.

FIG. 10 is a block diagram of flash memory device 100 according to another embodiment of the inventive concept. The embodiment of FIG. 10 is another variation of the embodiment of FIG. 1.

In the embodiment of FIG. 10, flash memory device 100 comprises memory cell array 110, data input/output circuit 120, row decoder 130, control logic/voltage generator 140, CSL driver 150, CSL feedback circuit 160, and a CSL feedback control logic 190. With the exception of CSL feedback control logic 190, the numbered elements in FIG. 10 are the same as the corresponding elements in FIG. 1. Accordingly, a further description of the repeated elements will be omitted for conciseness.

CSL feedback control logic 190 is connected to control logic/voltage generator 140 and controls the supply of a voltage compensated for CSL voltage $V_{CSL}$ to a selected word line or a selected bit line in a program verify operation. For example, CSL feedback control logic 190 can convert CSL voltage $V_{CSL}$, compensated by CSL feedback circuit 160, into a digital value and use the digital value to generate a control code for controlling voltage generator 140. Accordingly, CSL feedback control logic 190 can control voltage generator 140 to generate voltages compensated based on CSL voltage $V_{CSL}$.

Figure 11:
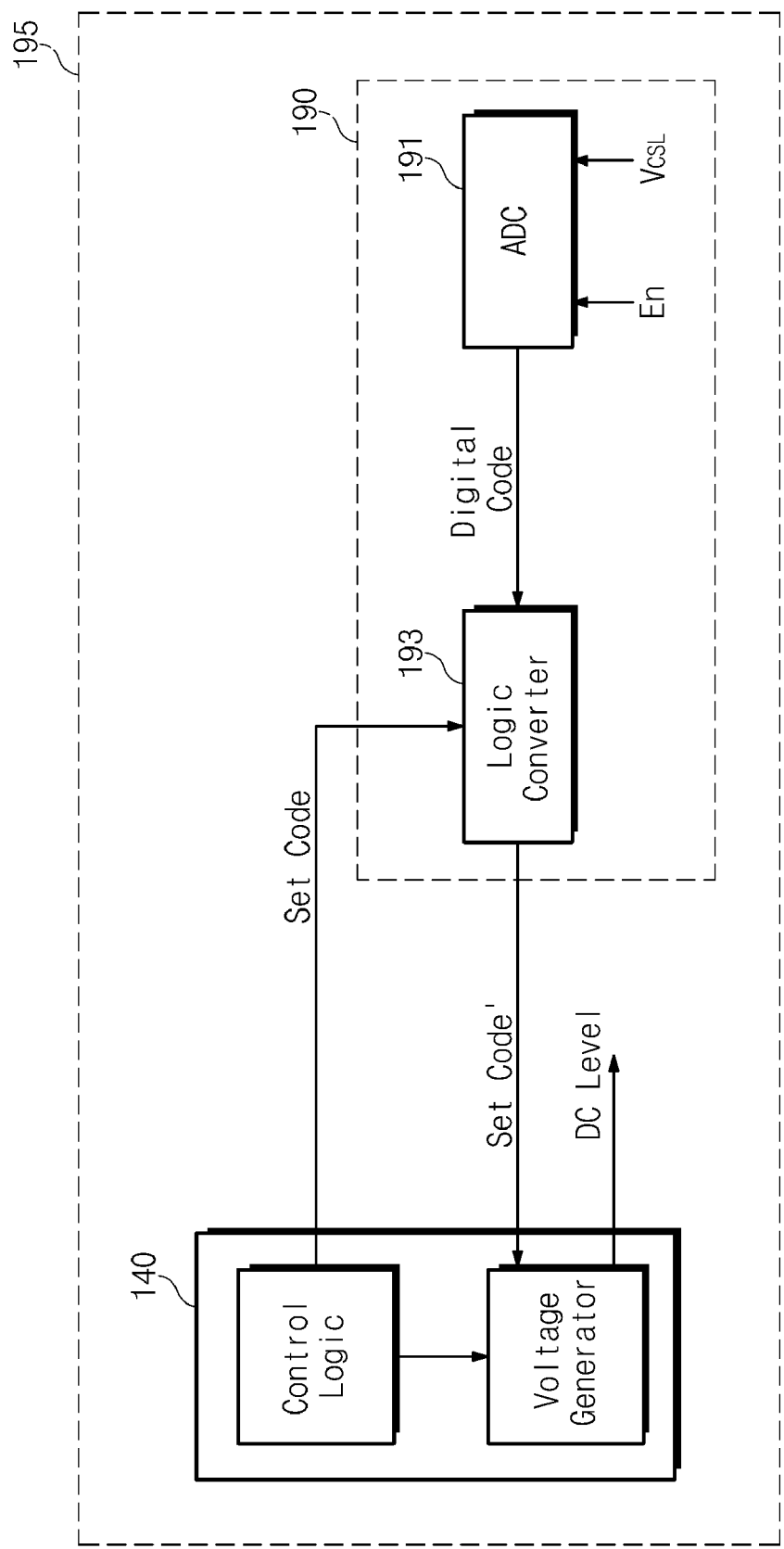
FIG. 11 is a block diagram illustrating common source line feedback control logic in the flash memory device of FIG. 10.

FIG. 11 is a block diagram illustrating an embodiment of CSL feedback control logic 190 of FIG. 10.

Referring to FIG. 11, CSL feedback control logic 190 comprises an analog-to-digital converter (ADC) 191 and a logic converter 193.

ADC 191 is connected to CSL feedback circuit 160 of FIG. 10. ADC 191 receives control signal En from control logic 140 and receives CSL voltage $V_{CSL}$ from CSL feedback circuit 160 of FIG. 10. ADC 191 converts the received CSL voltage $V_{CSL}$ into a digital value and provides the digital value to logic converter 193.

Logic converter 193 is connected to control logic/voltage generator 140. Logic converter 193 receives a set code from control logic 140 and receives the digital value of CSL voltage $V_{CSL}$ from ADC 191. The set code received from control logic 140 is used to control voltage generator 140 and determine the voltage generated by voltage generator 140.

In a program verify operation, logic converter 193 applies the digital value of CSL voltage $V_{CSL}$ to the input set code value to generate a new set code value (set code'). Where control signal En is not applied by control logic 140 to ADC 191, ADC 191 does not provide CSL voltage $V_{CSL}$ to the logic converter 193. In this case, logic converter 193 retains and applies the previous CSL voltage $V_{CSL}$ to generate a new set code value (set code'), or generates the new set code value (set code') without applying CSL voltage $V_{CSL}$. The new set code value (set code') is provided to voltage generator 140, and voltage generator 140 uses the new set code value (set code') to generate the voltage supplied to the selected word line or the selected bit line.

In a program verify operation, CSL feedback control logic 190 can interrupt a feedback loop that is used by CSL feedback circuit 160 of FIG. 10 to compensate for CSL voltage $V_{CSL}$. Where control logic 140 performs an on or off operation by controlling control signal En provided to ADC 191, logic converter 193 does or does not apply CSL voltage $V_{CSL}$ when generating the new set code value (set code'). Accordingly, CSL voltage $V_{CSL}$ is selectively compensated for in a program verify operation and a resulting constant voltage is provided to a selected word line or a selected bit line to perform a stable program verify operation.

Figure 12:
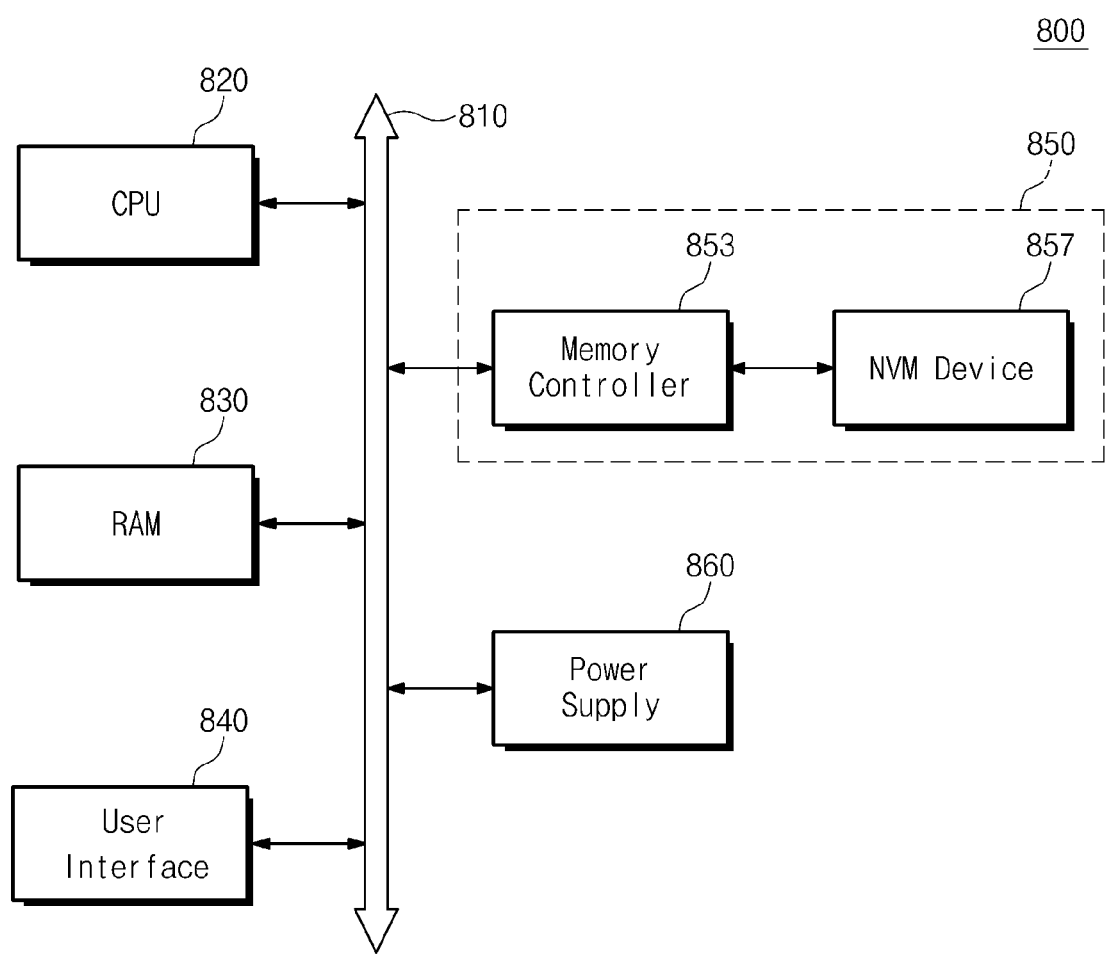
FIG. 12 is a block diagram of a memory system incorporating a flash memory device according to an embodiment of the inventive concept.

FIG. 12 is a block diagram of a memory system incorporating a flash memory device according to an embodiment of the inventive concept.

Referring to FIG. 12, a memory system 800 comprises a system bus 810, a central processing unit (CPU) 820, a random access memory (RAM) 830, a user interface 840, a nonvolatile memory (NVM) device 850, and a power supply unit 860.

Nonvolatile memory device 850 is electrically connected to memory system 800 through a system bus 810. Nonvolatile memory device 850 comprises a memory controller 853 and a nonvolatile memory 857. Data provided through user interface 840 or processed by CPU 820 is stored in nonvolatile memory 857 through memory controller 853.

Although not illustrated in FIG. 12, memory system 800 can further comprise other elements, such as an application chipset and a camera image processor.

Figure 13:
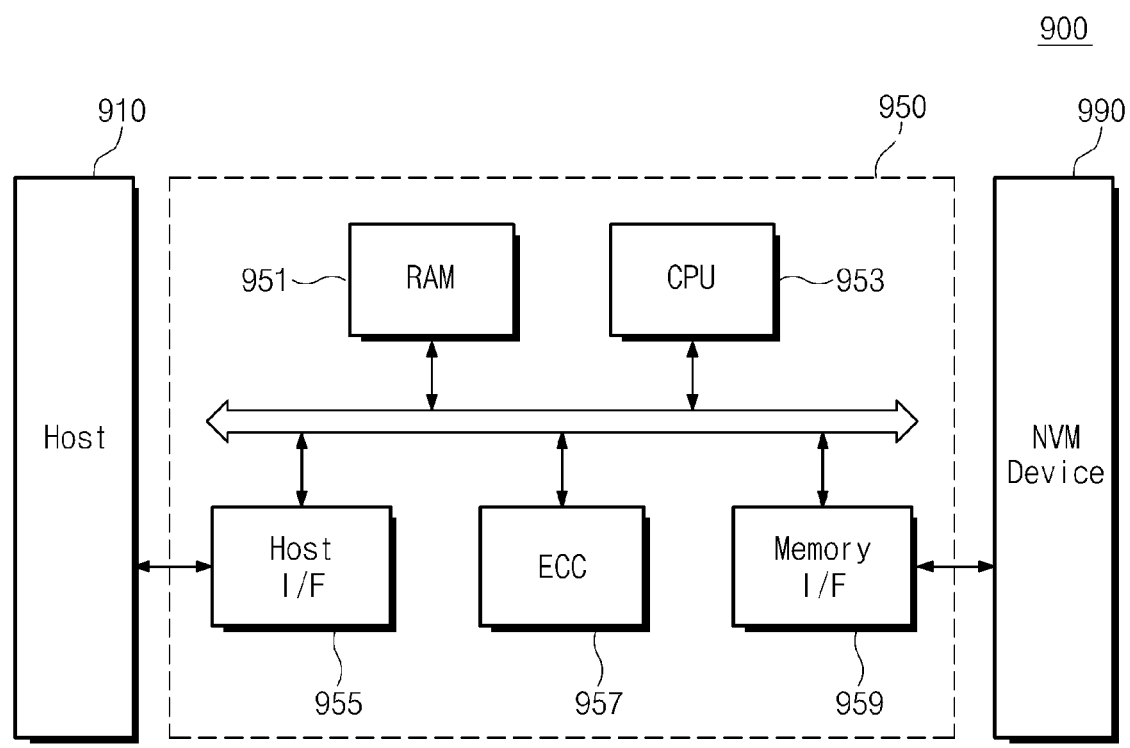
FIG. 13 is a block diagram of a memory system incorporating a flash memory device according to another embodiment of the inventive concept.

FIG. 13 is a block diagram of a memory system incorporating a flash memory device according to another embodiment of the inventive concept.

Referring to FIG. 13, a memory system 900 comprises a memory controller 950 and a nonvolatile memory (NVM) device 990.

Memory controller 950 is connected to a host 910 and nonvolatile memory device 990. Memory controller 950 is configured to access the nonvolatile memory device 990 in response to a request from host 910. For example, memory controller 950 is typically configured to control read, write, and erase operations of nonvolatile memory device 990. Memory controller 950 is configured to provide an interface between the nonvolatile memory device 990 and host 910. Memory controller 950 is configured to drive firmware for controlling nonvolatile memory device 990.

Memory controller 950 comprises a RAM 951, a CPU 953, a host interface (I/F) 955, an error correcting code (ECC) unit 957, and a memory interface 959. RAM 951 is typically used as a working memory of CPU 953. CPU 953 controls an overall operation of memory controller 950.

Host interface 955 implements a protocol for data exchange between host 910 and memory controller 950. For example, memory controller 950 can be configured to communicate with an external device (e.g., host 910) through one of various interface protocols such as universal serial bus (USB) protocol, multimedia card (MMC) protocol, peripheral component interconnection (PCI) protocol, PCI-express (PCI-E) protocol, advanced technology attachment (ATA) protocol, Serial ATA (SATA) protocol, enhanced small disk interface (ESDI) protocol, and integrated drive electronics (IDE) protocol.

ECC 957 can be configured to detect and correct errors in data read from nonvolatile memory device 990. For example, ECC unit 957 can be provided as a component of memory controller 950. As another example, ECC unit 957 can be provided as a component of nonvolatile memory device 990. Memory interface 959 can interface with nonvolatile memory device 990. Although not illustrated in FIG. 13, memory system 900 can further comprise additional components, such as a read-only memory (ROM) that stores code data for interfacing with host 910.

In some embodiments, memory controller 950 and nonvolatile memory device 990 can be integrated into one semiconductor device to constitute a memory card. For example, memory controller 950 and nonvolatile memory device 990 can be integrated into one semiconductor device to constitute a memory card such as a personal computer memory card international association (PCMCIA) card, a compact flash (CF) card, a smart media card, a memory stick, a multimedia card (e.g., MMC, RS-MMC and MMC-micro), a secure digital (SD) card (e.g., SD, mini-SD, micro-SD and SDHC), or a universal flash storage (UFS) card.

In various embodiments, memory system 900 can be incorporated into a variety of different types of devices, such as solid state drives, computers, portable computers, ultra mobile personal computers (UMPCs), work stations, netbooks, personal digital assistants (PDAs), web tablets, wireless phones, mobile phones, digital cameras, digital audio recorders, digital audio players, digital video recorders, digital video players, devices capable of transmitting/receiving information in wireless environments, one of various electronic devices constituting a home network, one of various electronic devices constituting a computer network, one of various electronic devices constituting a telematics network, RFID devices, or embedded systems.

In addition, in various embodiments, nonvolatile memory device 990 or memory system 900 can be mounted in various types of packages. Examples of packages for nonvolatile memory device 990 or memory system 900 include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

As indicated by the foregoing, flash memory devices according to certain embodiments of the inventive concept can prevent an increase in the width of threshold voltage distributions due to the noise on a common source line.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A flash memory device comprising:
   a plurality of memory cells connected between a bit line and a common source line (CSL);
   a plurality of word lines connected to the respective memory cells;
   a CSL feedback circuit connected to the common source line to detect a voltage level of the common source line; and
   CSL feedback control logic configured to control a voltage level of a selected word line or a selected bit line to be compensated to a constant level based on the voltage level detected by the CSL feedback circuit and independent of a voltage level change of the common source line during a sensing operation of the plurality of memory cells.

2. The flash memory device of claim 1, wherein the CSL feedback control logic selectively interrupts compensation of the selected word line by causing the selected word line to be electrically floated during the sensing operation.

3. The flash memory device of claim 2, wherein the CSL feedback control logic comprises:
   a transistor configured to cut off a voltage from being transferred to the selected word line;
   a capacitor connected to the transistor to maintain an electrical floating state of the selected word line while the voltage is cut off from the selected word line; and
   switch logic connected to the transistor to control the transistor.

4. The flash memory device of claim 1, wherein the CSL feedback control logic selectively interrupts compensation of the selected bit line by causing a gate of a transistor that selects the selected bit line to be electrically floated during the sensing operation.

5. The flash memory device of claim 4, wherein the CSL feedback control logic comprises:
   a first transistor configured to cut off a voltage from being transferred to a gate of a second transistor selecting the selected bit line;
   a capacitor connected to the gate of the second transistor to maintain an electrical floating state of the gate of the second transistor selecting the selected bit line while the voltage is cut off from the gate of the second transistor; and
   a switch logic connected to the first transistor to control the first transistor.

6. The flash memory device of claim 1, wherein the CSL feedback control logic converts the voltage level of the common source line into a digital value and selectively applies the converted voltage level to a voltage generator during the sensing operation to provide a voltage generation control code.

7. The flash memory device of claim 6, wherein the CSL feedback control logic comprises:
   an analog-to-digital converter configured to convert the voltage level of the common source line into the digital value; and
   a logic converter configured to selectively apply the converted voltage level to the voltage generator to provide the voltage generation control code.

8. A method of operating a flash memory device, comprising:
   precharging a selected bit line connected to a selected memory cell;
   detecting a voltage level of a common source line before sensing a precharged voltage of the selected bit line;
   controlling a voltage level of a selected word line or a selected bit line of the selected memory cell to be compensated to a constant voltage based on the detected common source line voltage; and
   sensing the precharged voltage of the selected bit line.

9. The method of claim 8, wherein the detecting of the voltage level of the common source line is completed before the sensing of the precharged voltage of the selected bit line.

10. The method of claim 8, wherein the selected memory cell is a memory cell programmed to a target threshold voltage.

11. The method of claim 8, wherein a program verify voltage is applied to the selected word line of the selected memory cell during the sensing of the precharged voltage of the selected bit line.

12. The method of claim 8, wherein the selected word line is electrically floated after the voltage level of the selected word line is compensated to a constant voltage based on the detected common source line voltage.

13. The method of claim 8, wherein the selected bit line is precharged through a transistor and the detected common source line voltage is compensated to produce a gate voltage of the transistor.

14. The method of claim 13, wherein the gate of the transistor is electrically floated after the detected common source line voltage is compensated to produce the gate voltage of the transistor.

15. The method of claim 8, wherein the voltage level the selected word line or the selected bit line compensated with the common source line voltage is maintained substantially constant during the sensing of the precharged voltage of the selected bit line, independent of a voltage change of the common source line.

16. A memory system comprising:
   a flash memory device comprising a selected memory cell connected between a common source line (CSL) and a selected bit line, and a selected word line connected to the selected memory cell; and
   a memory controller configured to control the flash memory device,
   wherein the flash memory device is configured such that a voltage level of the selected word line or the selected bit line is compensated to a constant voltage during a sensing operation of the selected memory cell based on a noise voltage detected on the CSL.

17. The memory system of claim 16, wherein the compensation of the selected word line is selectively interrupted by causing the selected word line to be electrically floated during the sensing operation.

18. The memory system of claim 16, wherein the compensation of the selected bit line is selectively interrupted by causing a gate of a transistor that selects the selected bit line to be electrically floated during the sensing operation.

19. The memory system of claim 16, wherein the voltage level of the selected word line or the selected bit line is maintained substantially constant during the sensing operation, independent of a voltage change of the common source line.

20. The memory system of claim 16, wherein the flash memory device and the memory controller form a solid state drive.

* * * * *